United States Patent
Anderson, III

(10) Patent No.: US 11,638,372 B2
(45) Date of Patent: Apr. 25, 2023

(54) ELECTRONIC COMPONENT CEILING MOUNTING METHODS

(71) Applicant: AmpThink, LLC, Garland, TX (US)

(72) Inventor: William C. Anderson, III, Dallas, TX (US)

(73) Assignee: AmpThink, LLC, Garland, TX (US)

( * ) Notice: Subject to any disclaimer, the term of this patent is extended or adjusted under 35 U.S.C. 154(b) by 0 days.

(21) Appl. No.: 17/703,037

(22) Filed: Mar. 24, 2022

(65) Prior Publication Data
US 2022/0217880 A1    Jul. 7, 2022

Related U.S. Application Data

(63) Continuation of application No. 17/144,935, filed on Jan. 8, 2021, now abandoned.

(60) Provisional application No. 62/958,790, filed on Jan. 9, 2020.

(51) Int. Cl.
*H05K 13/04*    (2006.01)
*H05K 5/02*    (2006.01)

(52) U.S. Cl.
CPC ....... *H05K 13/0447* (2013.01); *H05K 5/0204* (2013.01)

(58) Field of Classification Search
CPC .................. H05K 5/0204; H05K 13/0447
See application file for complete search history.

(56) References Cited

U.S. PATENT DOCUMENTS

| | | | | |
|---|---|---|---|---|
| 5,867,913 A | * | 2/1999 | Pettigrew | B23D 49/11 30/500 |
| 6,241,368 B1 | * | 6/2001 | Depino | F21V 21/04 362/147 |
| 2008/0149360 A1 | * | 6/2008 | Dinh | H02G 3/123 30/360 |
| 2017/0310095 A1 | * | 10/2017 | Herth | H02G 3/123 |

* cited by examiner

*Primary Examiner* — Donghai D Nguyen
(74) *Attorney, Agent, or Firm* — James R. Banowsky

(57) ABSTRACT

Techniques described herein relate to integrating an electronic component into a ceiling mount in a ceiling tile system so as to maintain the aesthetic integrity of the ceiling while providing a suitable structural system to secure the equipment into the ceiling.

7 Claims, 6 Drawing Sheets

US 11,638,372 B2

ELECTRONIC COMPONENT CEILING MOUNTING METHODS

CROSS-REFERENCE TO RELATED APPLICATIONS

This application is a continuation of U.S. patent application Ser. No. 17/144,935 filed Jan. 8, 2021, which claims priority to U.S. Provisional Application 62/958,790, filed Jan. 9, 2020. The contents of each of the above-captioned patent applications are hereby expressly incorporated herein by reference in their entireties.

BACKGROUND

Equipment for wireless products is commonly installed in drop tile ceilings in all manner of facilities using various systems. A common configuration of a ceiling mounted electronic component system 100 (FIG. 1) includes a multi-tile ceiling 102 that includes a securing panel 104 that replaces a ceiling tile. The securing panel 104 secures an electronic component 106 to hang from the ceiling 102. The basis of such systems is that the securing panel secures the electronic component 106 and provides the structural support required to safely carry the weight of the electronic component 106. But as FIG. 1 illustrates, the aesthetic integration into the ceiling grid is poor, since the securing panel 104 typically looks different than the multi-tile ceiling 102. The different panel creates a significantly different visual that is generally disfavored. In addition, these systems add substantial weight to the ceiling which is material in seismically sensitive buildings. Furthermore, although existing systems allow for the integration of an access point into a tile, the systems require precise modification of the tile including cutting the tile with a razor knife using a template (see, e.g., Cisco-Air-AP-Bracket-3). Time and effort expended in making such modifications is significant. Furthermore, such systems also typically lack elements that allow the electronic device to be reliably secure from tampering or theft.

SUMMARY

Techniques described herein relate to integrating an electronic component, such as a wireless network access point, into a ceiling tile system in such a way as to maintain the aesthetic integrity of the ceiling while providing a suitable structural system to secure the equipment into the ceiling. Furthermore, the described techniques reduce time and effort required in other electronic component mounting systems. The techniques are not limited to access point solutions but may also be used with different types of equipment, such as antennas, cameras, speakers, and the like. The techniques include one or more apparatuses for quickly and precisely cutting the mounting solution into a specified tile.

BRIEF DESCRIPTION OF THE DRAWINGS

A particular description of the principles briefly described above will be rendered by reference to specific embodiments thereof, which are illustrated in the appended drawings. Understanding that these drawings depict only certain exemplary embodiments of the disclosure and are not therefore to be considered to limit its scope, the principles herein are described and explained with additional specificity and detail through the use of the accompanying drawings.

DETAILED DESCRIPTION

FIGS. 2-5 depict apparatuses and processes for installing an electronic component, such as a wireless network access point, in a ceiling tile. Apparatuses are shown that include a trim ring cutting system that can be used to create a precise cutout in a ceiling tile and, in some embodiments, a backer panel that provides support and security to the mounted electronic component when installed as described. The apparatuses can be used to cut a precise opening in a ceiling tile, finish the cut opening, and securely mount the electronic component in a more efficient manner than is available with prior art techniques.

Figure 2A:
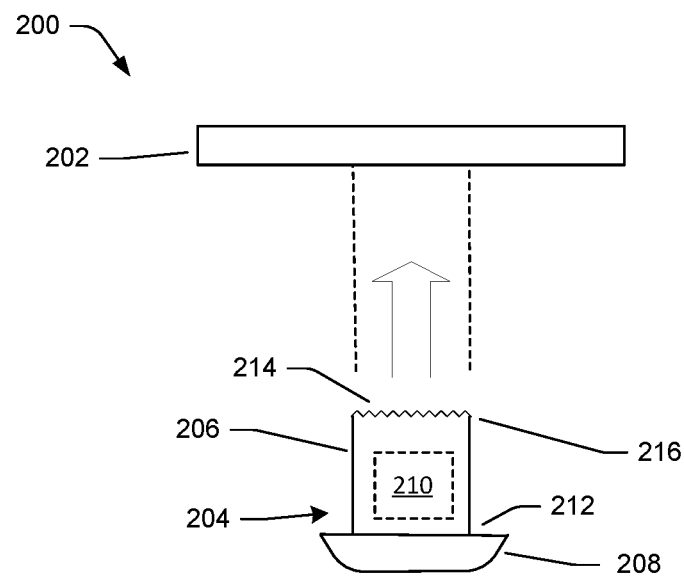
FIG. 2a depicts a basic apparatus for performing the techniques described herein, shown in a first stage of use.
Figure 2B:
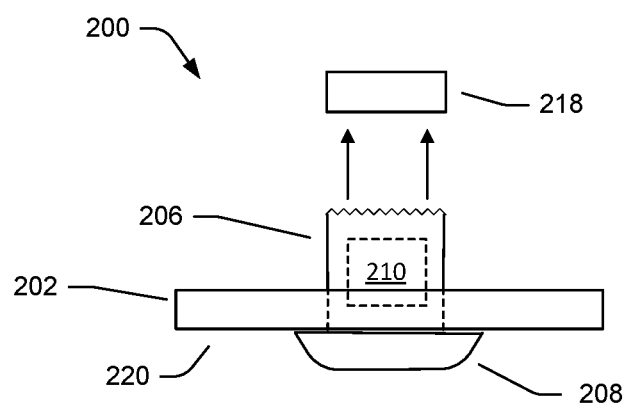
FIG. 2b depicts the basic apparatus of FIG. 2a in a second stage of use.

FIGS. 2a and 2b broadly depict an apparatus and a general method for mounting an electronic component in a ceiling tile. FIG. 2a shows a ceiling assembly 200 that includes a ceiling tile 202 and a mounting apparatus 204. The mounting apparatus 204 includes a can 206 and a housing 208. An electronic component 210 is mounted in the can 206, and the housing 208 connects to the can 206 to conceal the electronic component 210 and the can 206 from view.

In the embodiment depicted in FIG. 2a and FIG. 2b, it is assumed that the ceiling tile 202 is strong enough to support the mounting apparatus 204 and the electronic component 210, and that the ceiling tile 204 is made of a material sufficiently soft to be cut with a manual tool. The electronic component 210 is mounted inside the can 206 according to any method known in the art. Other embodiments described herein relate to situations where such assumptions are not true, and re-enforcement means are used.

The can 206 is a cylinder shape, although other shapes may be used for a can in different embodiments. The housing 208 connects to a first end 212 of the can 206. A cutting edge 214 of the can 206 is located on a second end 216 of the can 206 disposed opposite of the first end 212 of the can 206. The cutting edge 214 is serrated so that the cutting edge can be used to form a can-shaped hole in the ceiling tile 204. The serrated cutting edge 214 may be integrated with the can 206 or it may be a separate component disposed on the second end 216 of the can 206. The cutting edge 214 isn't required to be serrated. In at least one embodiment, the cutting edge 214 may be fitted with one or more razor or knife edges to perform the same function attributed herein to the serrated cutting edge 214.

FIG. 2a depicts a first stage of operation wherein the can 206—with the housing 210 affixed thereto and the electronic component 210 mounted therein—is used to create a hole in the ceiling tile 202 so that the can 206 can be inserted into the hole. FIG. 2b depicts a second stage of operation wherein punched material 218 from the ceiling tile is discarded, and the can 206 and electronic component 210 are inserted into the ceiling tile 202 to a point where the housing 208 is flush with a bottom side 220 of the ceiling tile 202. It is noted that the can 206 may be inserted through the ceiling tile 202 before the electronic component 210 is mounted therein and/or before the housing 208 is attached thereto. Once the housing 208 is flush with the bottom side 220 of the ceiling tile 202, a securing mechanism, such as a locking pin (not shown) may be used to hold the ceiling assembly 200 in place by any means known in the art to secure a can to a ceiling. The electronic component 210 may be wired to a local electrical and/or Wi-Fi network at any time during the installation process.

Figure 3A:
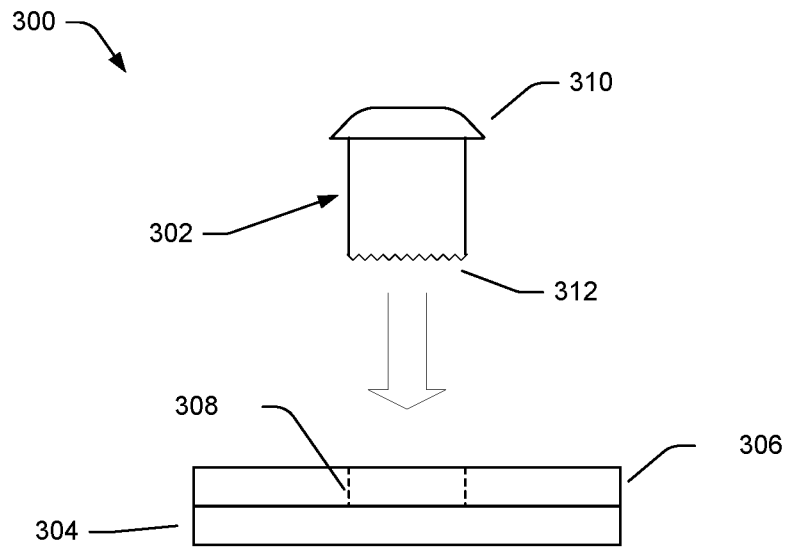
FIG. 3a depicts a system suitable for performing the techniques described herein, shown in a first stage of use.

FIG. 3a depicts a system 300 suitable for performing the techniques described herein, said system 300 shown in a first stage of use. In addition to the ceiling assembly 200 shown in FIG. 2a and FIG. 2b, the system 300 provides a way to quickly and accurately locate a position to install an electronic component mount 302 in a ceiling tile 304. In addition, the system 300 provides additional support for the electronic component mount 302 when the ceiling tile 304 is unable to properly support the weight of the electronic component mount 302 on its own.

Figure 1:
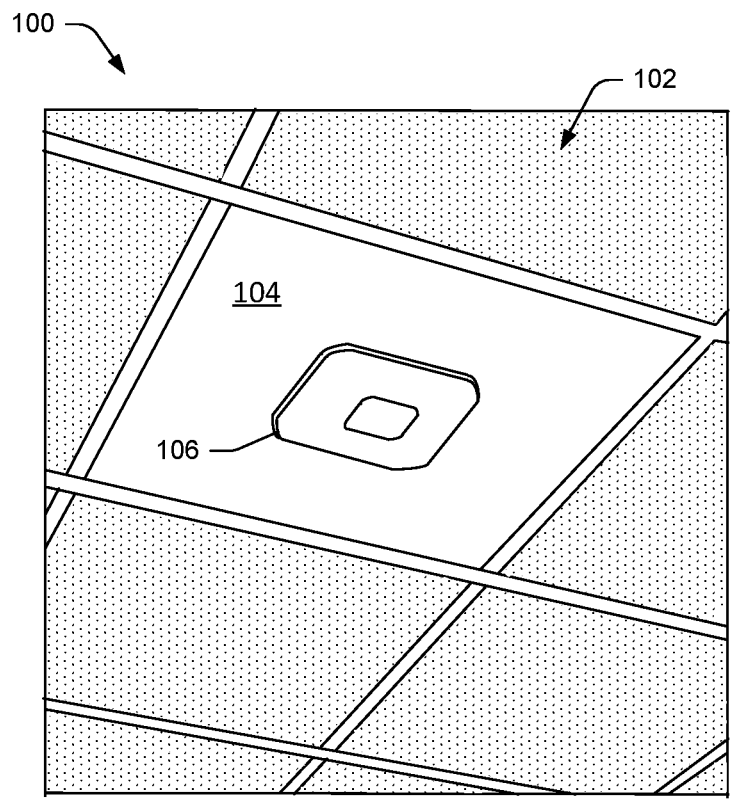
FIG. 1 depicts a prior art access point mounted in a ceiling tile.

In the first stage of use depicted in FIG. 3a, a backer plate 306 is aligned with the ceiling tile 304. The backer plate 306 is comprised of a material that is sufficient to support the weight of the electronic component mount 302 and an electronic component installed therein (not shown). Although the backer plate 306 is typically formed of plastic or metal, it's possible that the backer plate 306 may be formed from similar material that makes up the ceiling tile 304, such as an acoustic material. The backer plate 306 is approximately the same size as the ceiling tile 304, so that it fits in a ceiling tile grid system (FIG. 1, 100) that supports the ceiling tile 304. The backer plate 306 has an opening 308 formed therethrough, said opening 308 approximating the size and shape of the electronic component mount 302. When the backer plate 306 and the ceiling tile 304 are aligned, the opening 308 in the backer plate 306 aligns with a desired location of the electronic component mount 302 in the ceiling tile 304.

The electronic component mount 302 includes a housing 310 located at one end and a cutting edge 312 located at an opposite end. Although the cutting edge 312 is shown integrated with the electronic component mount 302 in the present example, it is noted that the cutting edge 312 may be on a separate unit that is releasably connectable to the electronic component mount 302 so as to be in the same position shown herein. Further, although the housing 308 is shown attached to the electronic component mount 302 in this example, it is noted that the housing 308 may be separable from the electronic component mount 302 and the process depicted herein may be completed using only the electronic component mount 302 without the housing 308 installed.

Figure 3B:
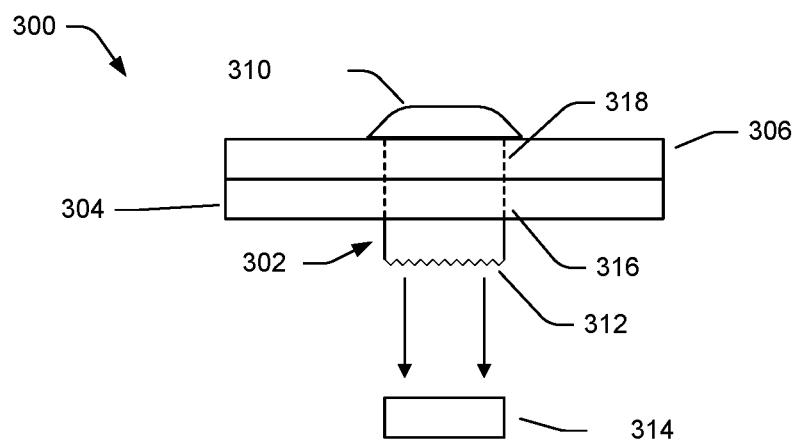
FIG. 3b depicts the system of FIG. 3a in a second stage of use.

The component mount 302 is inserted into the opening 308 so that the cutting edge 312 engages the ceiling tile 304 as shown. FIG. 3b depicts the system in a second stage of use, wherein as pressure is applied to the component mount 302, the cutting edge 312 cuts the ceiling tile 304, removing punched material 314 from the ceiling tile as a hole 316 is formed in the ceiling tile 304. The hole 316 approximates the shape and width of a cylinder 318 of the component mount 302, thus allowing the component mount 302 to be mounting in the ceiling tile 304 as described below, with respect to subsequent figures.

Figure 3C:
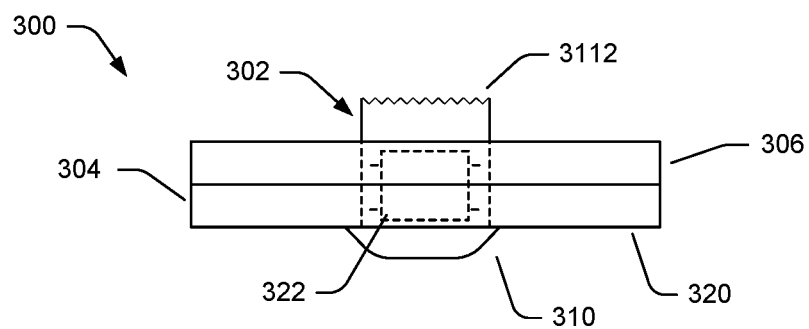
FIG. 3c depicts the system of FIG. 3a in a third stage of use.

FIG. 3c depicts the system 300 in a third stage of use. The system 300 includes the component mount 302, the ceiling tile 304, and the backer plate 306 shown and described previously. In this stage of use, the component mount 302 has been removed from its previous position in the ceiling tile 304 and backer plate 306. The orientation of the component mount 302 is reversed and reinserted into the hole 316 that was formed in the previous step until the housing 310 is flush with a bottom side 320 of the ceiling tile 304. The component mount 302 may then be fixed in place by any method known in the art. An electronic component 322 is then mounted into the component mount 302. The electronic component 322 may be mounted at any stage of the described process, as practicality permits.

Figure 3D:
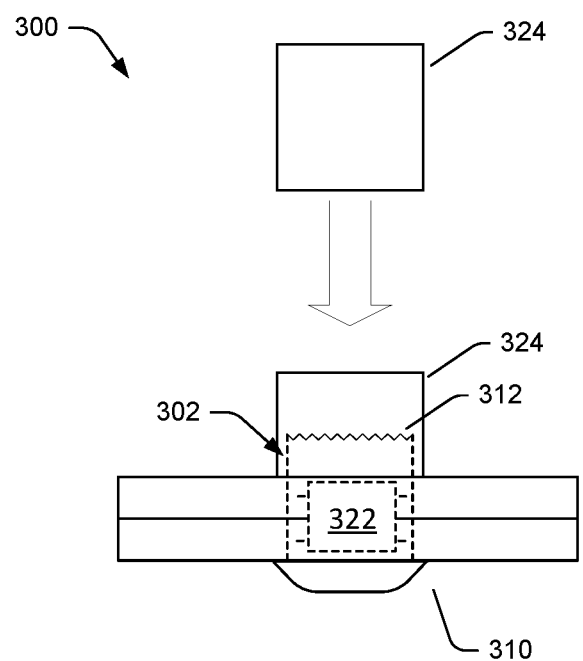
FIG. 3d depicts the system of FIG. 3a in a fourth stage of use.

FIG. 3d depicts the system 300 in a fourth stage of use, wherein a protective cover 324 is installed over the component mount 302 to protect the electronic component 322 and the component mount 302, and also to prevent injury from the cutting edge 312 being exposed. The electronic component 322 is thus mounted in the ceiling tile 304 in a desired location, where only the housing 310 is exposed. Moreover, the electronic component 322 has additional support from the backer plate 306 to further secure the electronic component 322 to the ceiling tile 304 and to make it more difficult for unauthorized removal of the electronic component 322.

Figure 4A:
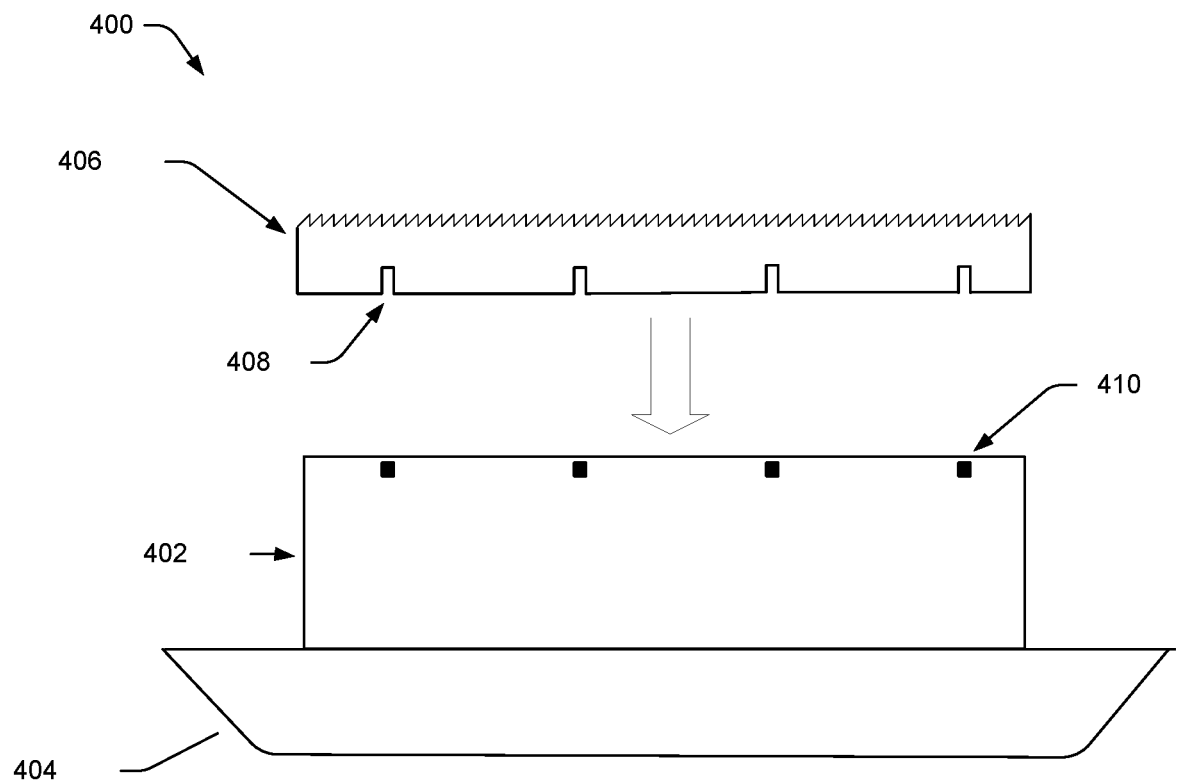
FIG. 4a is an illustration of a system used to form an opening in a ceiling tile having a removeable cutting ring in a separated position relative to a component mount.

FIG. 4a is an illustration of an example component mount system 400 in accordance with the present description. The example component mount system 400 includes a component mount 402, a housing 404, and a cutting ring 406. The example component mount system 400 is capable of forming an opening in a ceiling tile to allow insertion of an electronic component (not shown) mounted inside the component mount 402. The cutting ring 406 is removable and is shown in a separated position relative to a component mount 402. The cutting ring 406 further includes multiple notches 408 that correspond with multiple keys 410 that are part of the component mount 402.

Figure 4B:
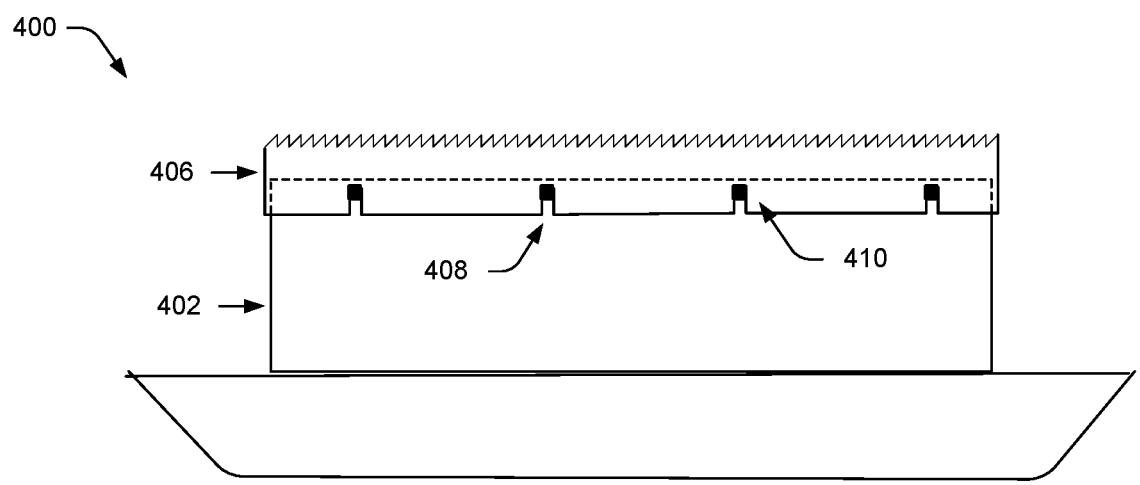
FIG. 4b is an illustration of the system shown in FIG. 4a having the removeable cutting ring in a connected position relative to the component mount.

FIG. 4b is an illustration of the example component mount system 400 shown in FIG. 4a having the removeable cutting ring 406 in a connected position relative to the component mount 402. In the connected position, the notches 408 are integrated with the keys 410 to hold the cutting ring 406 in place as it is used to cut a ceiling tile. The notches 408 securing the cutting ring 406 on the component mount 402 when a torqueing motion is applied to the component mount 402, for example, when using the component mount 402 to saw through a ceiling tile. After a ceiling tile is cut with the cutting ring 406, the cutting ring 406 may be removed or left in place. It is noted that although the cutting ring 406 is shown having a serrated edge, the cutting ring 406 may include a sharp edge, such as a razor edge or other type of cutting edge, in place of the serrated edge.

Figure 5A:
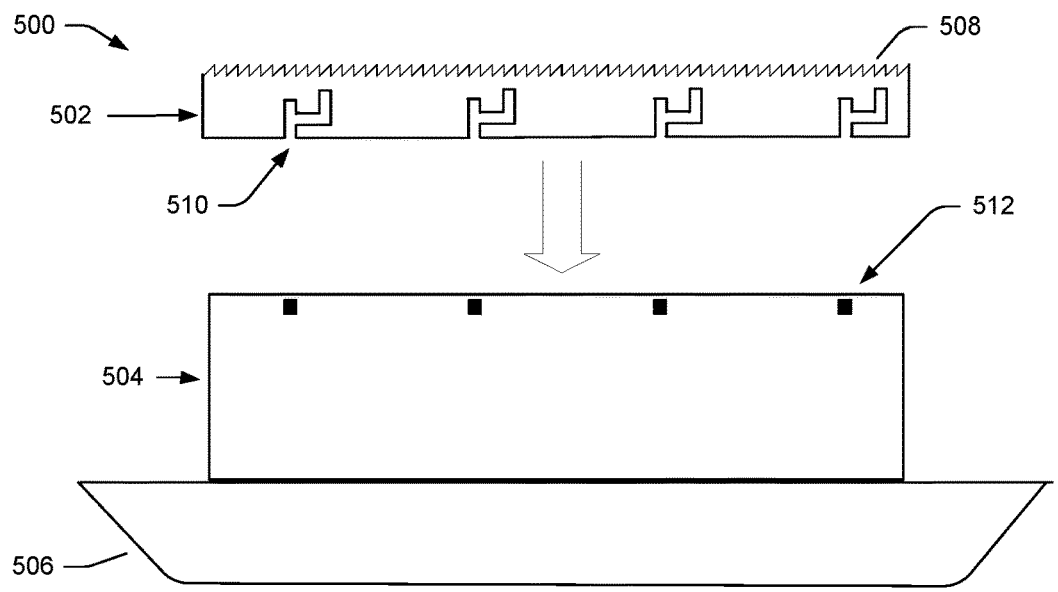
FIG. 5a depicts a system used to form an opening in a ceiling tile having a removeable/retractable cutting ring in a separated position relative to a ceiling mount.
Figure 5B:
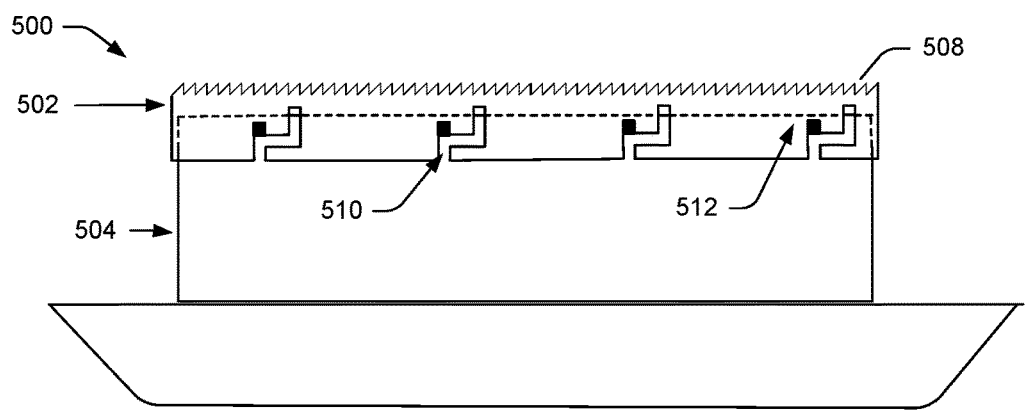
FIG. 5b depicts the system shown in FIG. 5a with a removeable/retractable cutting ring in an extended and locked position.
Figure 5C:
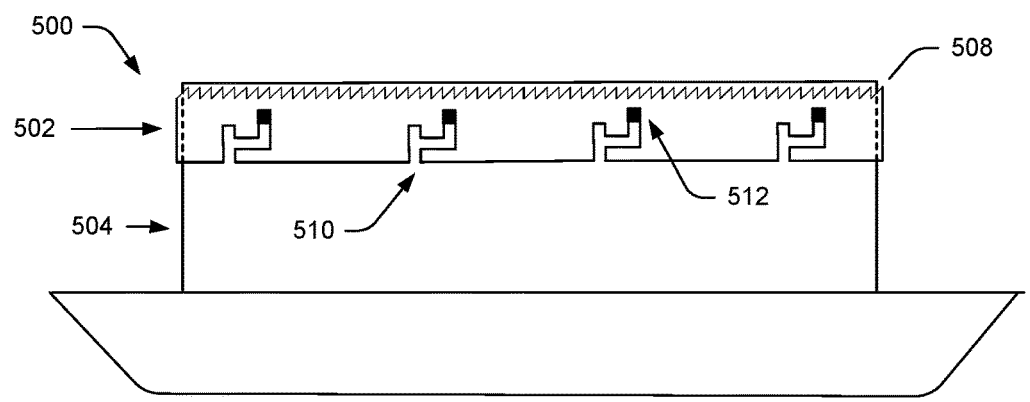
FIG. 5c depicts the system shown in FIG. 5a with a removeable/retractable cutting ring in a retracted and locked position.

FIGS. 5a-5c depict an example component mount system 500 having a removable/retractable cutting ring 502 removably connectable to a component mount 504. The example component mount system 500 also includes a housing 506 attached to the component mount 504. The example component mount system 500 can be used to form an opening in a ceiling tile using the techniques described herein. The cutting ring 502 includes a cutting edge 508 and multiple notches 510 that correspond to multiple keys 512 disposed on the component mount 504. FIG. 5a shows the cutting ring 502 detached from the component mount 504.

FIG. 5b shows the cutting ring 502 disposed in an extended position wherein the cutting edge 508 of the cutting ring 502 is disposed above the component mount 504. The notches 510 in the cutting ring 502 are moveable between a first position and a second position. FIG. 5b shows the notches 510 in the first position, which enables the cutting ring 502 to be placed in the extended position. The notches 510 act as a securing mechanism to secure the cutting ring 502 on the component mount 504 when a torqueing motion is applied to the component mount 504, for example, when using the component mount 504 to saw through a ceiling tile. Other techniques known in the art may be used as a securing mechanism for this purpose.

FIG. 5c shows the cutting ring 502 disposed in a retracted position wherein the cutting edge 508 of the cutting ring 502 is not disposed above the component mount 504. The notches 510 are shown in the second position, which enable the cutting ring 502 to be retracted to a position wherein the cutting edge 508 of the cutting ring 502 is not exposed beyond the component mount 504. After a hole has been cut in a ceiling tile, the cutting ring 502 may be retracted for safety reasons. In at least one implementation, the cutting ring 502 can be detached and removed from the component mount 504 rather than being put into the retracted position. Removing the cutting ring 502 after installation of the component mount 504 allows for the cutting ring 502 to be re-used with a different component mount (not shown).

CONCLUSION

While the invention is described with respect to certain embodiments and/or generally associated methods, alterations and permutations of these embodiments and application to any application, such as a Wi-Fi network deployment, a person having ordinary skill in the art will recognize other applications in which the presently described techniques may be used. Accordingly, the above description of example embodiments does not define or constrain this disclosure. Other changes, substitutions, and alterations are also possible without departing from the spirit and scope of this disclosure, as defined by the following claims.

The invention claimed is:

1. A method for installing an electronic component mounting apparatus, comprising:
   aligning a backer plate with a ceiling tile such that the backer plate indicates where to form an opening in the ceiling tile;
   forming the opening in the ceiling tile with a cutting edge integrated with an electronic component mount;
   securing the electronic component mount to the ceiling tile and the backer plate; and
   wherein the back plate approximates a size of the ceiling tile.

2. The method as recited in claim 1, wherein the backer plate provides support to the electronic component mount when the electronic component mount is installed.

3. A method for installing an electronic component in a ceiling having at least one ceiling tile, comprising:
   using a template to mark a location to install a component mount in the ceiling tile;
   cutting a hole in the ceiling at the marked location using a cutting edge that is integrated with a first end of the component mount;
   inserting the component mount through the hole in the ceiling so that the first end of the component extends about the ceiling tile;
   securing the component mount to the ceiling tile; and
   fixing the template to the ceiling tile such that when the ceiling tile is installed, the template is disposed above the ceiling tile.

4. The method as recited in claim 3, wherein the template further comprises a backing plate that provides support to the component mount when the electronic component mount is installed.

5. A method for installing an electronic component mounting apparatus, comprising:
   forming a hole in a ceiling tile with a cutting edge integrated with an electronic component mount;
   inserting an electronic component mount through the hole in the ceiling tile so that a housing of the electronic component is substantially flush with a side of the ceiling tile;
   securing the electronic component mount to the ceiling tile; and
   securing a protective cover over the cutting edge of the electric component mount.

6. The method as recited in claim 5, further comprising removing the cutting edge from the electronic component mount.

7. The method as recited in claim 5, wherein the cutting edge further comprises a retractable cutting edge, and the method further comprises retracting the cutting edge of the electronic component mount.

* * * * *